US008352002B2

(12) United States Patent
Kawashima

(10) Patent No.: US 8,352,002 B2
(45) Date of Patent: Jan. 8, 2013

(54) SUPERCONDUCTOR COOLING SYSTEM AND SUPERCONDUCTOR COOLING METHOD

(75) Inventor: Hiroshi Kawashima, Hyogo (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 834 days.

(21) Appl. No.: 12/509,963

(22) Filed: Jul. 27, 2009

(65) Prior Publication Data

US 2010/0113282 A1 May 6, 2010

(30) Foreign Application Priority Data

Oct. 30, 2008 (JP) ................................ 2008-280366

(51) Int. Cl.
*H01L 39/02* (2006.01)
*H01F 6/02* (2006.01)
*F28F 27/00* (2006.01)

(52) U.S. Cl. ........ 505/211; 505/163; 505/892; 505/893; 505/894; 174/15.4; 174/15.5; 335/216; 62/51.1; 62/259.2

(58) Field of Classification Search .................. 505/163, 505/211, 892–894, 899; 174/15.1, 15.4, 174/15.5; 335/216, 299–301; 324/318; 62/6, 62/51.1, 259.2
See application file for complete search history.

(56) References Cited

U.S. PATENT DOCUMENTS 5,686,876 A * 11/1997 Yamamoto et al. ........... 335/216
5,737,927 A * 4/1998 Takahashi et al. ............. 62/51.1
2008/0209919 A1* 9/2008 Ackermann et al. ........... 62/51.1

FOREIGN PATENT DOCUMENTS

JP 7142237 A 6/1995
JP 08-138928 * 5/1996
JP 2004111581 A 4/2004
JP 2004-111581 * 8/2004

* cited by examiner

*Primary Examiner* — Stanley Silverman
*Assistant Examiner* — Kallambella Vijayakumar
(74) *Attorney, Agent, or Firm* — Kanesaka Berner & Partners

(57) ABSTRACT

A superconductor cooling system has: a first superconductor; a first cooling conductor used for cooling the first superconductor; a first cooling unit configured to cool the first cooling conductor to a first temperature; and a current lead configured to supply a current to the first superconductor. Here, a part of a path of the current is formed of a second superconductor. The superconductor cooling system further has: a second cooling conductor used for cooling the second superconductor; a second cooling unit configured to cool the second cooling conductor to a second temperature; and a first thermal conduction switch connected between the first cooling conductor and the second cooling conductor to ON and OFF heat transfer between the first cooling conductor and the second cooling conductor.

15 Claims, 9 Drawing Sheets

<INITIAL COOLING>

<LATE COOLING AND RUNNING>

<HEATING>

<INITIAL COOLING>

<LATE COOLING AND RUNNING>

<HEATING>

SUPERCONDUCTOR COOLING SYSTEM AND SUPERCONDUCTOR COOLING METHOD

INCORPORATION BY REFERENCE

This application is based upon and claims the benefit of priority from Japanese patent application No. 2008-280366, filed on Oct. 30, 2008, the disclosure of which is incorporated herein in its entirety by reference.

BACKGROUND OF THE INVENTION

1. Field of the Invention

The present invention relates to a system and a method for cooling superconductors.

2. Description of Related Art

A superconducting electromagnet device using a superconducting coil put in a vacuum insulation container is known (refer to Japanese Laid-Open Patent Application JP-H07-142237 and Japanese Laid-Open Patent Application JP-2004-111581, for example). Such a superconducting coil is cooled by a superconducting coil cooling unit and goes into a superconducting state under an extremely-low temperature condition. It is possible to generate a strong magnetic field by supplying a current to the superconducting coil in the superconducting state. Here, a member for externally supplying the current to the superconducting coil is generally called a "current lead". That is to say, a drive current is supplied to the superconducting coil through the current lead when driving the superconducting coil.

In such a superconducting electromagnet device, heat intrusion caused by Joule heating at the current lead due to the current at the time of power distribution and heat intrusion from the outside of the vacuum insulation container to the superconducting coil through the current lead occur. In order to reduce the heat intrusion, a part of a current path in the current lead may be formed of a superconductor (refer to Japanese Laid-Open Patent Application JP-H07-142237 and Japanese Laid-Open Patent Application JP-2004-111581). Under the extremely-low temperature condition, an electric resistance of the superconductor in the current lead becomes small while heat resistance thereof becomes large. In this case, however, it is necessary to provide a current lead cooling unit for cooling the superconductor in the current lead, in addition to the superconducting coil cooling unit for cooling the superconducting coil. The superconductor in the current lead can be cooled without increasing heat load on the superconducting coil cooling unit.

To cool the superconducting coil rapidly to a target temperature means reduction in a time to starting-up of an operation of the superconducting coil. It is therefore important to reduce a cooling time of the superconducting coil. However, to unnecessarily increase cooling capacity of the superconducting coil cooling unit or to provide an additional superconducting coil cooling unit is not preferable, because it causes increase in costs and may be physically difficult in terms of a placement space.

SUMMARY

An object of the present invention is to provide a technique that can reduce a cooling time of a first superconductor in a case where a part of a current lead for supplying a current to the first superconductor is formed of a second superconductor.

In an aspect of the present invention, a superconductor cooling system is provided. The superconductor cooling system has: a first superconductor; a first cooling conductor used for cooling the first superconductor; a first cooling unit configured to cool the first cooling conductor to a first temperature; and a current lead configured to supply a current to the first superconductor. In the current lead, a part of a path of the current is formed of a second superconductor. The superconductor cooling system further has: a second cooling conductor used for cooling the second superconductor; a second cooling unit configured to cool the second cooling conductor to a second temperature; and a first thermal conduction switch connected between the first cooling conductor and the second cooling conductor to ON and OFF heat transfer between the first cooling conductor and the second cooling conductor.

In another aspect of the present invention, a superconductor cooling method in a superconductor cooling system is provided. The superconductor cooling system has: a first superconductor; a first cooling conductor used for cooling the first superconductor; a first cooling unit configured to cool the first cooling conductor to a first temperature; and a current lead configured to supply a current to the first superconductor. In the current lead, a part of a path of the current is formed of a second superconductor. The superconductor cooling system further has: a second cooling conductor used for cooling the second superconductor; and a second cooling unit configured to cool the second cooling conductor to a second temperature. The superconductor cooling method includes: performing an initial cooling by connecting between the first cooling conductor and the second cooling conductor to cool the first superconductor, before the current is supplied to the first superconductor; and performing a late cooling after the initial cooling, by disconnecting the first cooling conductor and the second cooling conductor from each other to cool the first superconductor and the second superconductor to the first temperature and the second temperature, respectively.

According to the present invention, the cooling time of the first superconductor can be reduced in the case where a part of the current lead for supplying the current to the first superconductor is formed of the second superconductor.

DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

1. First Embodiment

1-1. Configuration

Figure 1:
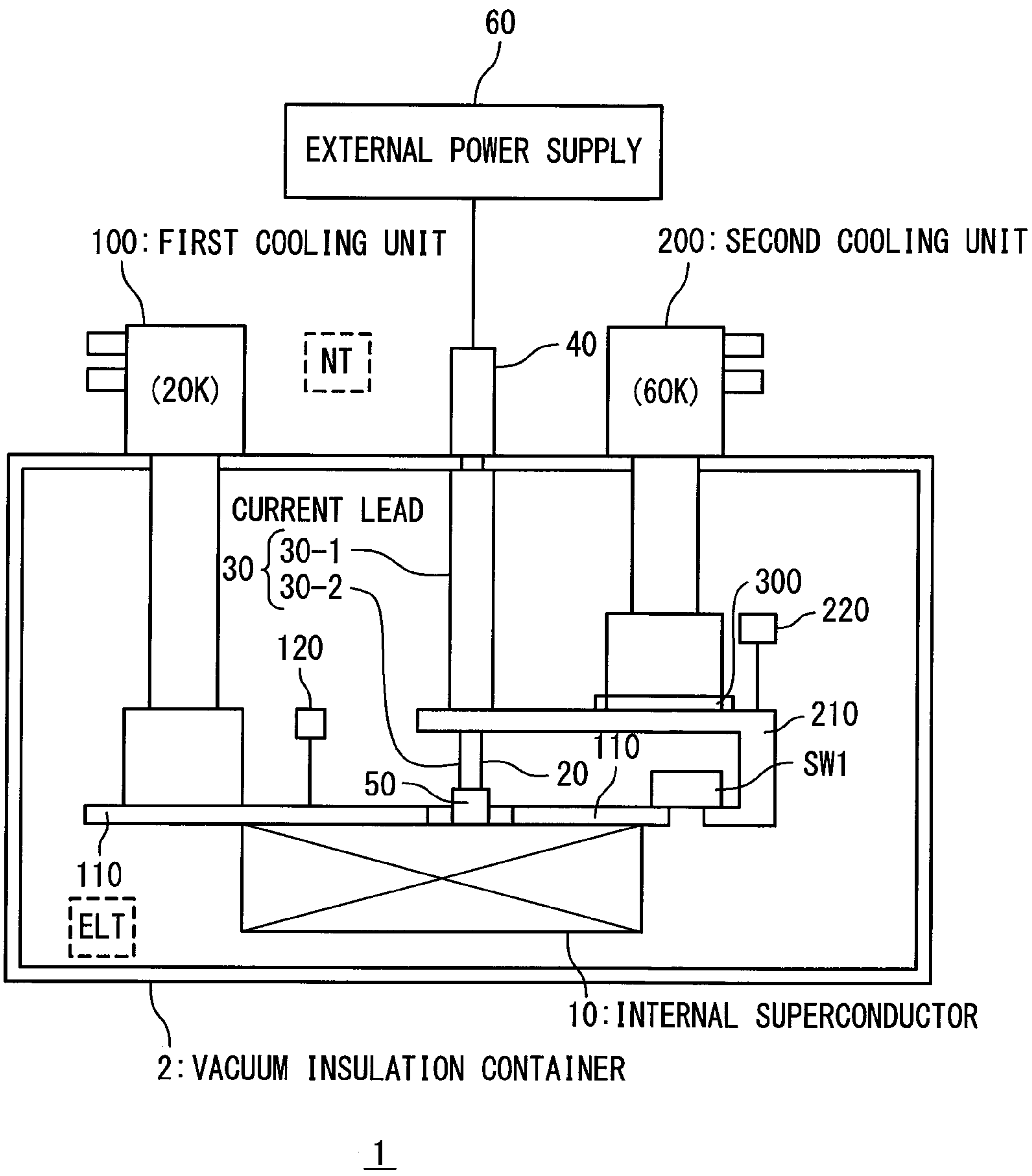
FIG. 1 is a schematic view showing a configuration of a superconductor cooling system according to a first embodiment of the present invention.

FIG. 1 is a schematic view showing a configuration of a superconductor cooling system 1 according to a first embodiment of the present invention. The superconductor cooling system 1 has a vacuum insulation container 2 in which an internal superconductor 10 is placed. The outside of the vacuum insulation container 2 is a normal temperature region (NT). On the other hand, the inside of the vacuum insulation container 2 where the internal superconductor 10 is placed is an extremely-low temperature region (ELT).

The internal superconductor 10 (first superconductor), which is used for a superconducting coil for example, goes into a superconducting state under an extremely-low temperature condition. It is possible to generate a strong magnetic field by supplying a current to the internal superconductor 10 in the superconducting state. A target temperature (first temperature) of the internal superconductor 10 at this time is 20 K for example.

A first cooling unit 100 is a cooling device (refrigerator) used for cooling the internal superconductor 10. More in detail, a first cooling conductor 110 used for cooling the internal superconductor 10 is provided within the vacuum insulation container 2. The first cooling conductor 110 is a copper conductor, for example. The first cooling unit 100 is connected to the first cooling conductor 110 and configured to cool the first cooling conductor 110 down to the above-mentioned first temperature. Additionally, a first temperature sensor 120 for detecting a temperature T1 of the first cooling conductor 110 may be provided within the vacuum insulation container 2.

A current lead 30 is a member for supplying a current to the internal superconductor 10 and is connected between an external power supply 60 outside the vacuum insulation container 2 and the internal superconductor 10 inside the vacuum insulation container 2. Here, heat intrusion caused by Joule heating at a normal-conducting current lead 30-1 at the time of power distribution and heat intrusion from the normal temperature region NT to the internal superconductor 10 through the current lead 30 may occur. In order to reduce the heat intrusion, a part of the current path in the current lead 30 is formed of a superconductor 20 (second superconductor). Under the extremely-low temperature condition, an electric resistance of the superconductor 20 becomes small while heat resistance thereof becomes large, which is preferable.

More specifically, as shown in FIG. 1, the current lead 30 includes a normal-conducting current lead 30-1 provided on a side of the external power supply 60 and a superconducting current lead 30-2 provided on a side of the internal superconductor 10. The normal-conducting current lead 30-1, which is a current lead using ordinary metallic material, is connected to the external power supply 60 through an electrical conductor 40. On the other hand, the superconducting current lead 30-2 is a current lead using the superconductor 20. The superconductor 20 is connected to the internal superconductor 10 through an electrical conductor 50. At a time of driving the internal superconductor 10, the current is supplied from the external power supply 60 to the internal superconductor 10 through the normal-conducting current lead 30-1 and the superconducting current lead 30-2. A target temperature (second temperature) of the superconductor 20 at this time is 60 K for example.

A second cooling unit 200 is a cooling device (refrigerator) used for cooling the superconductor 20 of the current lead 30. More in detail, a second cooling conductor 210 used for cooling the superconductor 20 is provided within the vacuum insulation container 2. The second cooling conductor 210 is a copper conductor, for example. The second cooling unit 200 is connected to the second cooling conductor 210 and is configured to cool the second cooling conductor 210 down to the above-mentioned second temperature. Additionally, a second temperature sensor 220 for detecting a temperature T2 of the second cooling conductor 210 may be provided within the vacuum insulation container 2.

In the present embodiment, the first temperature (e.g. 20 K) as the target temperature of the internal superconductor 10 is lower than the second temperature (e.g. 60 K) as the target temperature of the superconductor 20. The reason is as follows. First, the second temperature is set to near the upper limit of a usage temperature of the superconductor 20, from a viewpoint of optimization of current and heat conductive characteristics of the superconductor 20, an efficiency of the second cooling unit 200, reduction in an operating cost and so on. On the other hand, the first temperature is set far lower than the second temperature in order to use the internal superconductor 10 with higher performance and stably use the internal superconductor 10.

A heater 300 is provided in order to effectively perform a heating operation when the vacuum insulation container 2 is open. For example, the heater 300 is connected to the second cooling conductor 210.

As shown in FIG. 1, the superconductor cooling system 1 of the present embodiment is further provided with a first thermal conduction switch SW1 connected between the first cooling conductor 110 and the second cooling conductor 210. The first thermal conduction switch SW1 turns ON/OFF heat transfer between the first cooling conductor 110 and the second cooling conductor 210.

Figure 2:
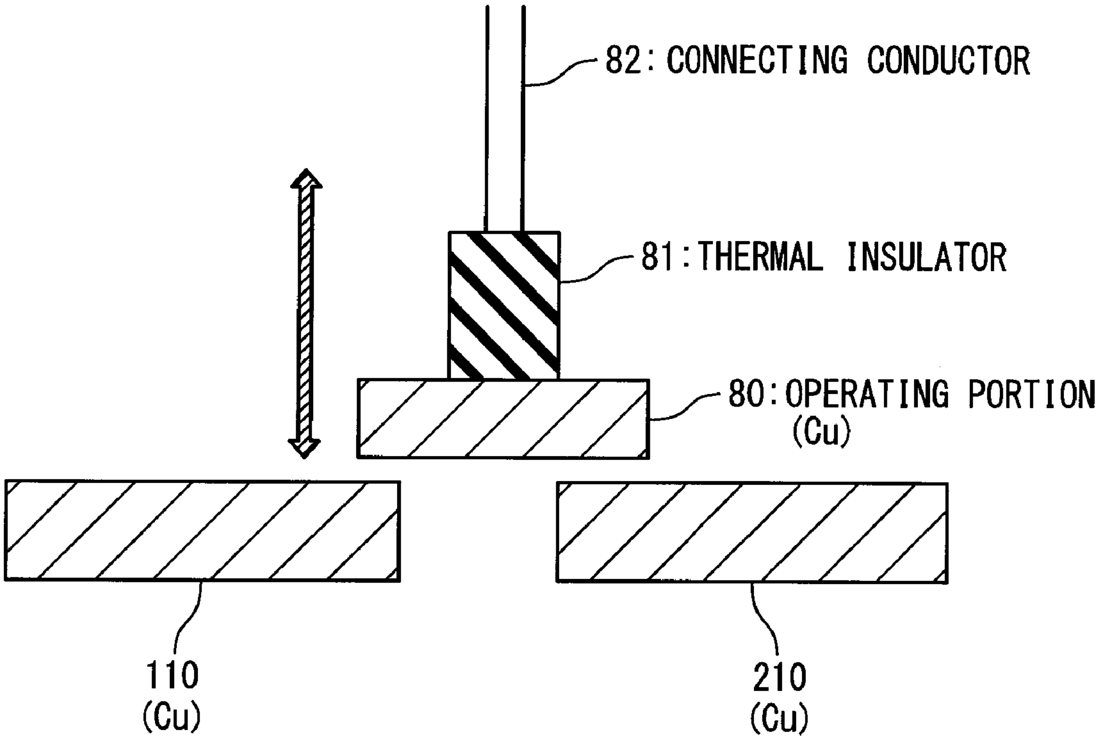
FIG. 2 shows one example of a thermal conduction switch.

FIG. 2 shows one example of the first thermal conduction switch SW1. The first thermal conduction switch SW1 has a connecting conductor 80 which can physically connect the first cooling conductor 110 and the second cooling conductor 210. Preferably, the connecting conductor 80 is made of the same material (e.g. copper) as the first cooling conductor 110 and the second cooling conductor 210. The connecting conductor 80 is connected to an operating portion 82 through a thermal insulator 81. By moving the operating portion 82, the connecting conductor 80 can be brought into contact with the first cooling conductor 110 and the second cooling conductor 210 and can be detached from the first cooling conductor 110 and the second cooling conductor 210. That is to say, ON/OFF control of the first thermal conduction switch SW1 is possible.

When the first thermal conduction switch SW1 is turned ON, the connecting conductor 80 is in contact with the first cooling conductor 110 and the second cooling conductor 210. As a result, the first cooling conductor 110 and the second cooling conductor 210 are physically connected through the connecting conductor 80 and thus the heat transfer is possible between the first cooling conductor 110 and the second cooling conductor 210. On the other hand, when the first thermal conduction switch SW1 is turned OFF, the connecting conductor 80 is detached from the first cooling conductor 110 and the second cooling conductor 210. As a result, the first cooling conductor 110 and the second cooling conductor 210 are disconnected from each other and thus the heat transfer between the first cooling conductor 110 and the second cooling conductor 210 is prevented.

Turning ON/OFF of the first thermal conduction switch SW1 may be performed manually or may be controlled automatically. In the case of the automatic control, the operating portion 82 is connected to an actuator. The actuator operates to ON/OFF control of the first thermal conduction switch SW1, depending on the temperature T1 of the first cooling conductor 110 detected by the first temperature sensor 120 or the temperature T2 of the second cooling conductor 210 detected by the second temperature sensor 220.

Alternatively, the first thermal conduction switch SW1 may be formed of bimetal whose shape and displacement are changed depending on temperature. For example, the bimetal is so formed as to be in contact with one of the first cooling conductor 110 and the second cooling conductor 210. When the temperature of the bimetal is higher than a predetermined temperature, the bimetal also comes into contact with the other of the first cooling conductor 110 and the second cooling conductor 210 as well. Consequently, the first thermal conduction switch SW1 is turned to the ON state. On the other hand, when the temperature of the bimetal is equal to or lower than the predetermined temperature, the bimetal is detached from the other of the first cooling conductor 110 and the second cooling conductor 210. Consequently, the first thermal conduction switch SW1 is turned to the OFF state.

1-2. Operation

Next, operations of the superconductor cooling system 1 according to the present embodiment will be described below. The operations of the superconductor cooling system 1 are roughly divided into: (1) a "cooling stage" for cooling the internal superconductor 10 and the superconductor 20 to near the respective target temperatures, before the power distribution to the internal superconductor 10; (2) a "running stage" for maintaining respective temperatures of the internal superconductor 10 and the superconductor 20, during the power distribution to the internal superconductor 10; and (3) a "heating stage" for heating the internal superconductor 10 and the superconductor 20, after the power distribution to the internal superconductor 10 is ended. Furthermore, according to the present embodiment, the above-mentioned cooling stage is further divided into an "initial cooling stage" and a "late cooling stage" performed after the initial cooling stage. In the following description, the target temperature (first temperature) of the internal superconductor 10 is 20 K and the target temperature (second temperature) of the superconductor 20 is 60 K.

[Initial Cooling Stage]

Figure 3:
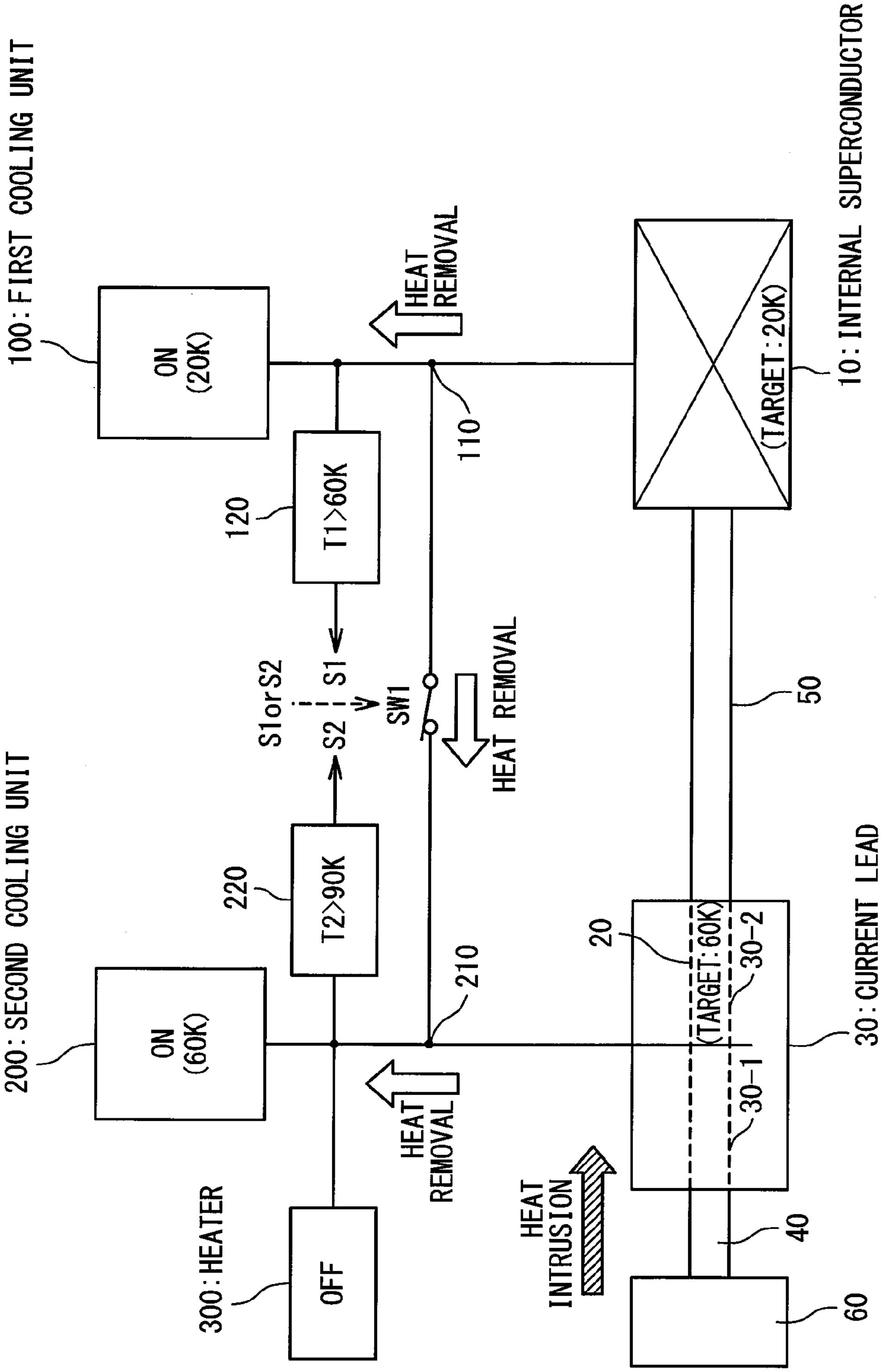
FIG. 3 is a schematic view showing an operation at a time of initial cooling according to the first embodiment.

FIG. 3 is a schematic view showing an operation at the time of initial cooling. At the time of the initial cooling, the first cooling unit 100 and the second cooling unit 200 are turned ON and the heater 300 is turned OFF. Further, according to the present embodiment, the first thermal conduction switch SW1 is turned ON. Consequently, the first cooling conductor 110 and the second cooling conductor 210 are connected with each other and thus the heat transfer between the first cooling conductor 110 and the second cooling conductor 210 is possible. As a result, the internal superconductor 10 is cooled (heat removal) through both of the first cooling conductor 110 and the second cooling conductor 210. That is to say, not only the first cooling unit 100 but also the second cooling unit 200, which is originally used for cooling the superconductor 20, is used together during the initial cooling of the internal superconductor 10. Since the first cooling unit 100 whose lowest reachable temperature is low but whose cooling capacity is small and the second cooling unit 200 whose lowest reachable temperature is high but whose cooling capacity is large are used together, a total cooling capacity is improved and thus the initial cooling can be performed in a short time.

The first thermal conduction switch SW1 may be turned ON manually by an operator.

Alternatively, the first thermal conduction switch SW1 may be turned ON automatically. For example, the first temperature sensor 120 detects the temperature T1 of the first cooling conductor 110 and outputs a first switch signal S1 depending on the detected temperature T1. The second temperature sensor 220 detects the temperature T2 of the second cooling conductor 210 and outputs a second switch signal S2 depending on the detected temperature T2. The first thermal conduction switch SW1 is turned ON and OFF in response to the first switch signal S1 or the second switch signal S2. For example, when the temperature T1 of the first cooling conductor 110 is higher than a predetermined temperature (e.g. 60 K), the first temperature sensor 120 activates the first switch signal S1. When the first switch signal S1 is activated, the first thermal conduction switch SW1 is turned ON. Alternatively, when the temperature T2 of the second cooling conductor 210 is higher than a predetermined temperature (e.g. 90 K), the second temperature sensor 220 activates the second switch signal S2. When the second switch signal S2 is activated, the first thermal conduction switch SW1 is turned ON.

Alternatively, the first thermal conduction switch SW1 may be formed of bimetal. For example, the bimetal is so formed as to be in contact with the first cooling conductor 110. When the temperature T1 of the first cooling conductor 110 is higher than a predetermined temperature (e.g. 60 K), the bimetal also comes into contact with the second cooling conductor 210 as well. Consequently, the first thermal conduction switch SW1 is turned ON. Alternatively, the bimetal is so formed as to be in contact with the second cooling conductor 210. When the temperature T2 of the second cooling conductor 210 is higher than a predetermined temperature (e.g. 90 K), the bimetal also comes into contact with the first cooling conductor 110 as well. Consequently, the first thermal conduction switch SW1 is turned ON.

[Late Cooling Stage and Running Stage]

Figure 4:
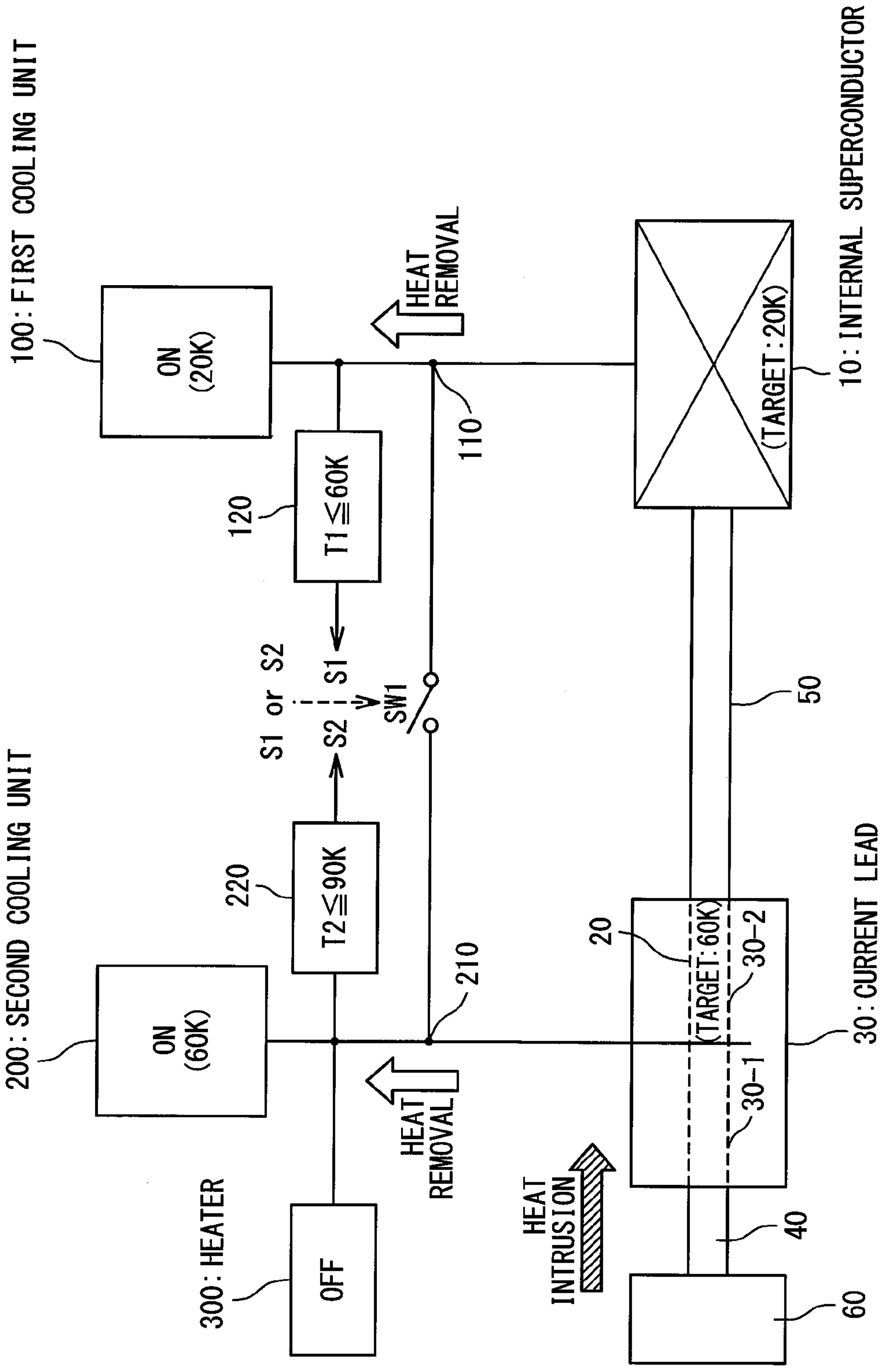
FIG. 4 is a schematic view showing an operation at a time of late cooling and running according to the first embodiment.

FIG. 4 is a schematic view showing an operation at the time of late cooling and running. As shown in FIG. 4, the first thermal conduction switch SW1 is turned OFF. Consequently, the first cooling conductor 110 and the second cooling conductor 210 are disconnected from each other and thus the heat transfer between the first cooling conductor 110 and the second cooling conductor 210 is prevented. At this time, the internal superconductor 10 is cooled (heat removal) by the first cooling unit 100 through the first cooling conductor 110. Also, the superconductor 20 is cooled (heat removal) by the second cooling unit 200 through the second cooling conductor 210.

When the first cooling conductor 110 and the internal superconductor 10 are cooled to near the first temperature (20 K) and the second cooling conductor 210 and the superconductor 20 are cooled to near the second temperature (60 K), the late cooling is ended. After that, the current is supplied to the internal superconductor 10 from the external power supply 60 through the current lead 30. At the time of the power distribution to the internal superconductor 10 (the running stage), the first thermal conduction switch SW1 is maintained at the OFF state. The temperature of the internal superconductor 10 is maintained by the first cooling unit 100, and the temperature of the superconductor 20 is maintained by the second cooling unit 200.

The first thermal conduction switch SW1 may be turned OFF manually by an operator.

Alternatively, the first thermal conduction switch SW1 may be turned OFF automatically. For example, when the temperature T1 of the first cooling conductor 110 becomes equal to or lower than a predetermined temperature (e.g. 60 K, which is the target temperature of the superconductor 20), the first temperature sensor 120 deactivates the first switch signal S1. Then, the first thermal conduction switch SW1 is turned OFF in response to the deactivation of the first switch signal S1. Alternatively, when the temperature T2 of the second cooling conductor 210 becomes equal to or lower than a predetermined temperature (e.g. 90 K), the second temperature sensor 220 deactivates the second switch signal S2. Then, the first thermal conduction switch SW1 is turned OFF in response to the deactivation of the second switch signal S2.

Alternatively, the first thermal conduction switch SW1 may be formed of bimetal. For example, the bimetal is so formed as to be in contact with the first cooling conductor 110. When the temperature T1 of the first cooling conductor 110 becomes equal to or lower than a predetermined temperature (e.g. 60 K), the bimetal is detached from the second cooling conductor 210. Consequently, the first thermal conduction switch SW1 is turned OFF. Alternatively, the bimetal is so formed as to be in contact with the second cooling conductor 210. When the temperature T2 of the second cooling conductor 210 becomes equal to or lower than a predetermined temperature (e.g. 90 K), the bimetal is detached from the first cooling conductor 110. Consequently, the first thermal conduction switch SW1 is turned OFF.

[Heating Stage]

Figure 5:
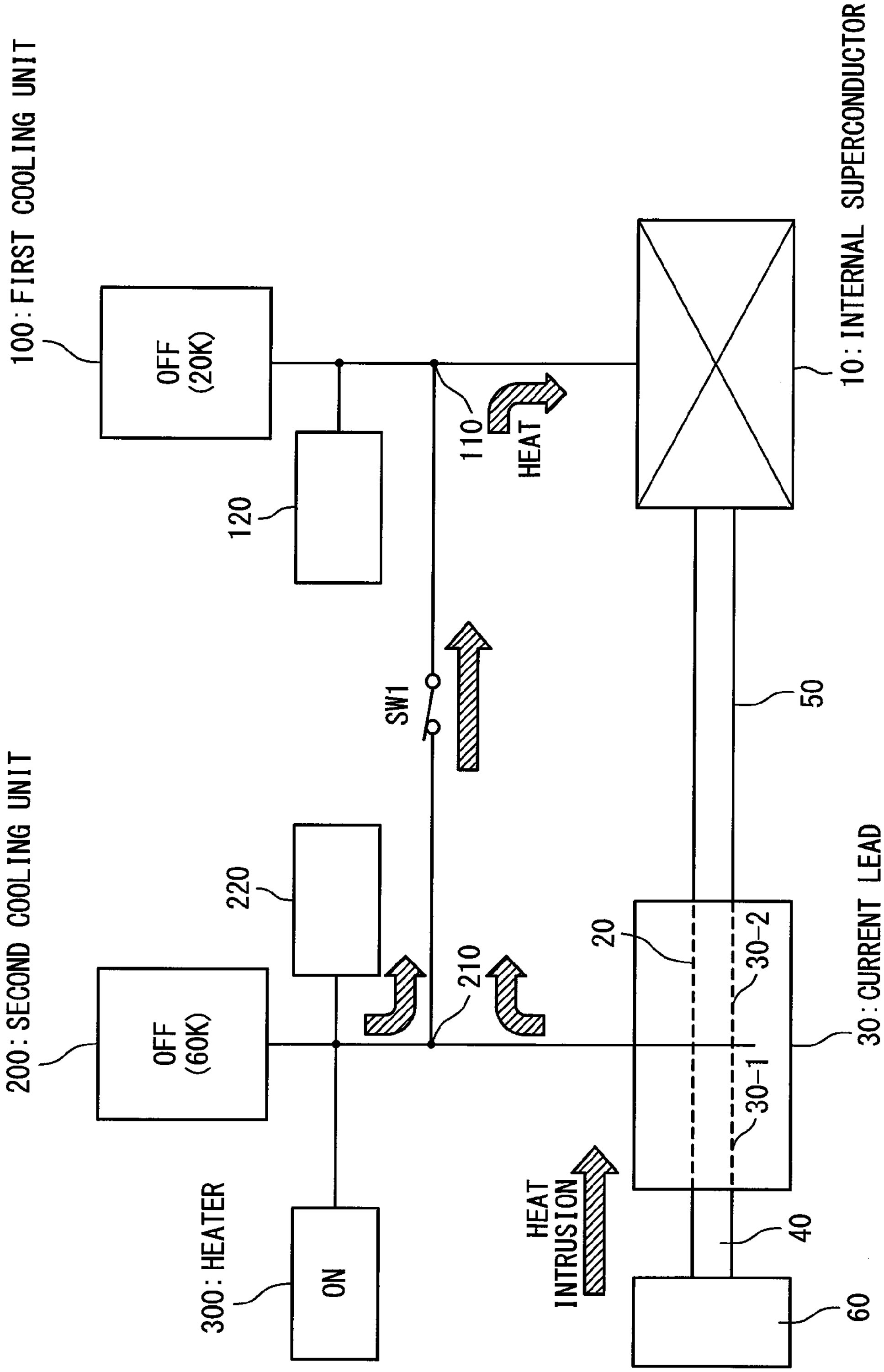
FIG. 5 is a schematic view showing an operation at a time of heating according to the first embodiment.

FIG. 5 is a schematic view showing an operation at the time of heating. At the time of the heating, the first cooling unit 100 and the second cooling unit 200 are turned OFF and the heater 300 is turned ON. Furthermore, according to the present embodiment, the first thermal conduction switch SW1 is turned ON. Consequently, the first cooling conductor 110 and the second cooling conductor 210 are connected with each other and thus the heat transfer between the first cooling conductor 110 and the second cooling conductor 210 is possible. Owing to the heat intrusion through the current lead 30 and heat generated by the heater 300, the temperatures of the first cooling conductor 110, the second cooling conductor 210, the internal superconductor 10 and the superconductor 20 are increased.

The first thermal conduction switch SW1 may be turned ON manually by an operator. Alternatively, the first thermal conduction switch SW1 may be turned ON automatically.

1-3. Effect

According to the present embodiment, the first cooling unit 100 whose lowest reachable temperature is low but whose cooling capacity is small and the second cooling unit 200 whose lowest reachable temperature is high but whose cooling capacity is large are used together during the initial cooling of the internal superconductor 10. It is therefore possible to reduce the cooling time of the internal superconductor 10 without increasing capacity of the cooling unit or providing an additional cooling equipment. That is to say, a time to the starting-up of the operation of the internal superconductor 10 can be shortened without increasing costs.

2. Second Embodiment 2-1. Configuration

Figure 6:
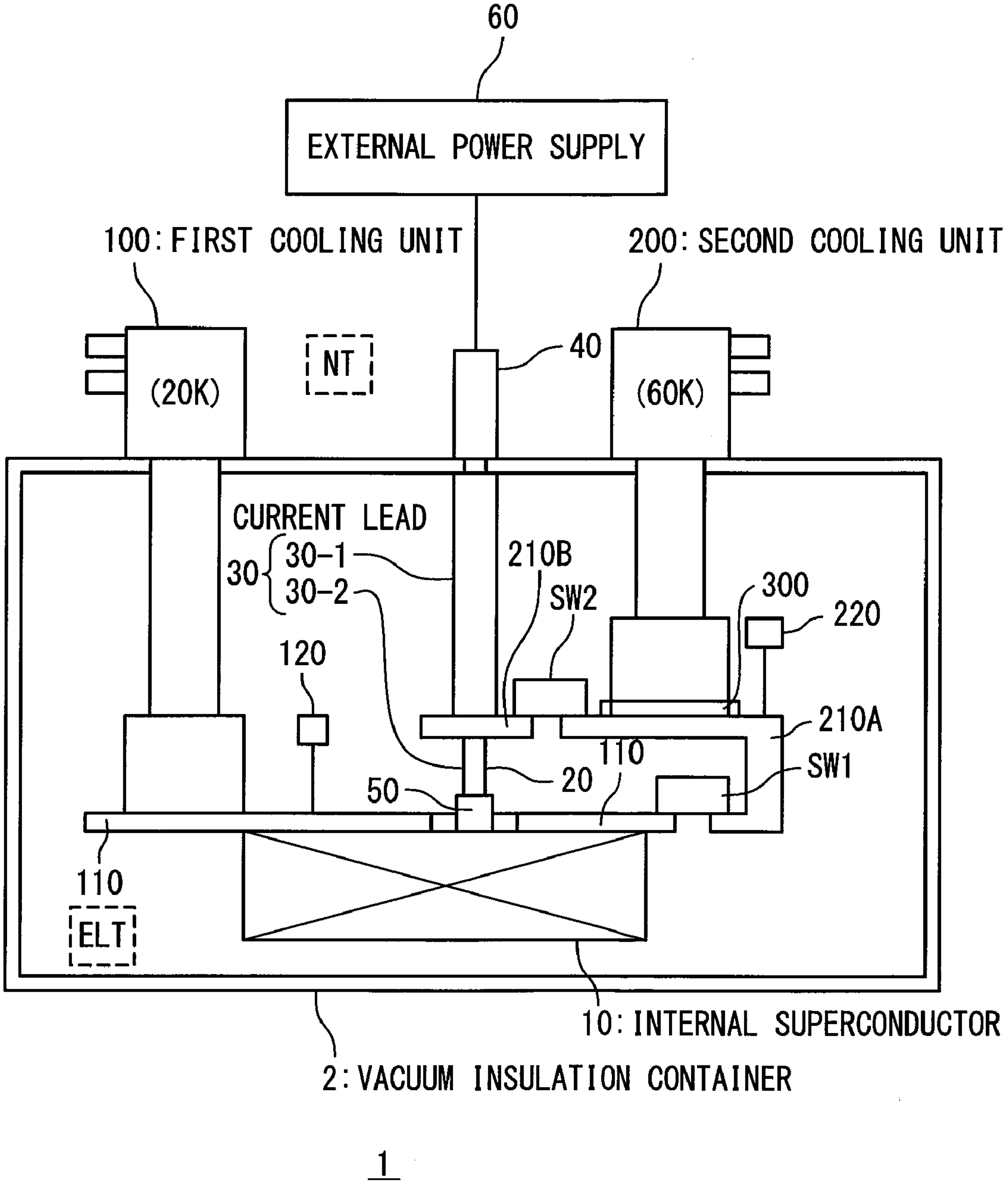
FIG. 6 is a schematic view showing a configuration of a superconductor cooling system according to a second embodiment of the present invention.

FIG. 6 is a schematic view showing a configuration of the superconductor cooling system 1 according to a second embodiment of the present invention. A description overlapping with the foregoing first embodiment will be omitted as appropriate.

According to the present embodiment, as shown in FIG. 6, a second thermal conduction switch SW2 is further provided on the second cooling conductor 210. More in detail, the second cooling conductor 210 has a cooling unit connector 210A located on a side of the second cooling unit 200, a current lead connector 210B located on a side of the superconductor 20 of the current lead 30, and the second thermal conduction switch SW2 connected between the cooling unit connector 210A and the current lead connector 210B. The second thermal conduction switch SW2 has the same configuration as the first thermal conduction switch SW1 and turns ON/OFF heat transfer between the cooling unit connector 210A and the current lead connector 210B. The second thermal conduction switch SW2 may have a configuration as shown in FIG. 2, or may be formed of bimetal whose shape and displacement are changed depending on temperature.

The first thermal conduction switch SW1 is connected between the first cooling conductor 110 and the cooling unit connector 210A of the second cooling conductor 210. The first thermal conduction switch SW1 has the same configuration as in the first embodiment and turns ON/OFF heat transfer between the first cooling conductor 110 and the cooling unit connector 210A.

The first temperature sensor 120 detects the temperature T1 of the first cooling conductor 110 and outputs the first switch signal S1 depending on the detected temperature T1. The second temperature sensor 220 detects the temperature T2 of the cooling unit connector 210A of the second cooling conductor 210 and outputs the second switch signal S2 depending on the detected temperature T2.

2-2. Operation

[Initial cooling stage]

Figure 7:
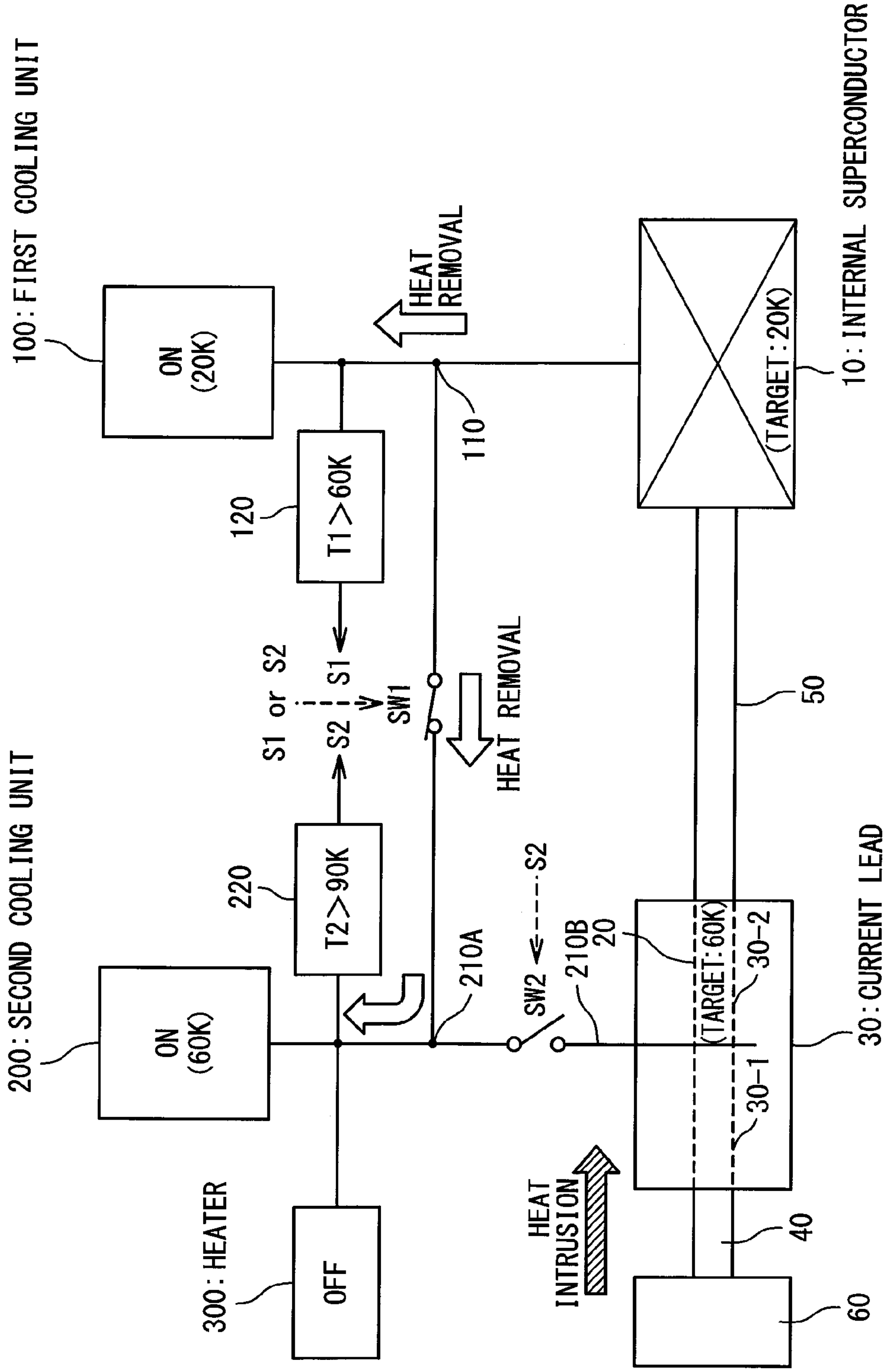
FIG. 7 is a schematic view showing an operation at a time of initial cooling according to the second embodiment.

FIG. 7 is a schematic view showing an operation at the time of, initial cooling. At the time of the initial cooling, the first cooling unit 100 and the second cooling unit 200 are turned ON and the heater 300 is turned OFF. Furthermore, according to the present embodiment, the first thermal conduction switch SW1 is turned ON and the second thermal conduction switch SW2 is turned OFF. Consequently, the first cooling conductor 110 and the cooling unit connector 210A are connected with each other and thus the heat transfer between the first cooling conductor 110 and the cooling unit connector 210A is possible. Moreover, the cooling unit connector 210A and the current lead connector 210B are disconnected from each other and thus the heat transfer between the cooling unit connector 210A and the current lead connector 210B is prevented.

As a result, the internal superconductor 10 is cooled (heat removal) through both of the first cooling conductor 110 and the cooling unit connector 210A. That is to say, not only the first cooling unit 100 but also the second cooling unit 200, which is originally used for cooling the superconductor 20, is used together during the initial cooling of the internal superconductor 10. Since the first cooling unit 100 and the second cooling unit 200 are used together, a total cooling capacity is improved and thus the initial cooling can be performed in a short time. Furthermore, since the second thermal conduction switch SW2 is turned OFF, the second cooling unit 200 and the current lead 30 are disconnected from each other. In this case, the second cooling unit 200 is not affected by heat intrusion through the current lead 30, and thus overall cooling capacity of the second cooling unit 200 can be fully used for cooling the internal superconductor 10. Therefore, the cooling time of the internal superconductor 10 can be reduced further.

The first thermal conduction switch SW1 and the second thermal conduction switch SW2 may be respectively turned ON and OFF manually by an operator.

Alternatively, the first thermal conduction switch SW1 and the second thermal conduction switch SW2 may be respectively turned ON and OFF automatically. For example, when the temperature T1 of the first cooling conductor 110 is higher than a predetermined temperature (e.g. 60 K), the first temperature sensor 120 activates the first switch signal S1. When the first switch signal S1 is activated, the first thermal conduction switch SW1 is turned ON. When the temperature T2 of the cooling unit connector 210A is higher than a predetermined temperature (e.g. 90 K), the second temperature sensor 220 deactivates the second switch signal S2. When the second switch signal SW2 is deactivated, the second thermal conduction switch SW2 is turned OFF. Alternatively, both of the first thermal conduction switch SW1 and the second thermal conduction switch SW2 may be controlled by the second switch signal S2. In this case, the first thermal conduction switch SW1 is turned ON and the second thermal conduction switch SW2 is turned OFF when the second switch signal S2 is deactivated.

Alternatively, the first thermal conduction switch SW1 may be formed of bimetal as described in the first embodiment. Moreover, the second thermal conduction switch SW2 may also be formed of bimetal as in the case of the first thermal conduction switch SW1. In this case, the bimetal is so formed as to be in contact with the cooling unit connector 210A. When the temperature T2 of the cooling unit connector 210A is higher than a predetermined temperature (e.g. 90 K), the bimetal is detached from the current lead connector 210B. Consequently, the second thermal conduction switch SW2 is turned OFF.

[Late Cooling Stage and Running Stage]

Figure 8:
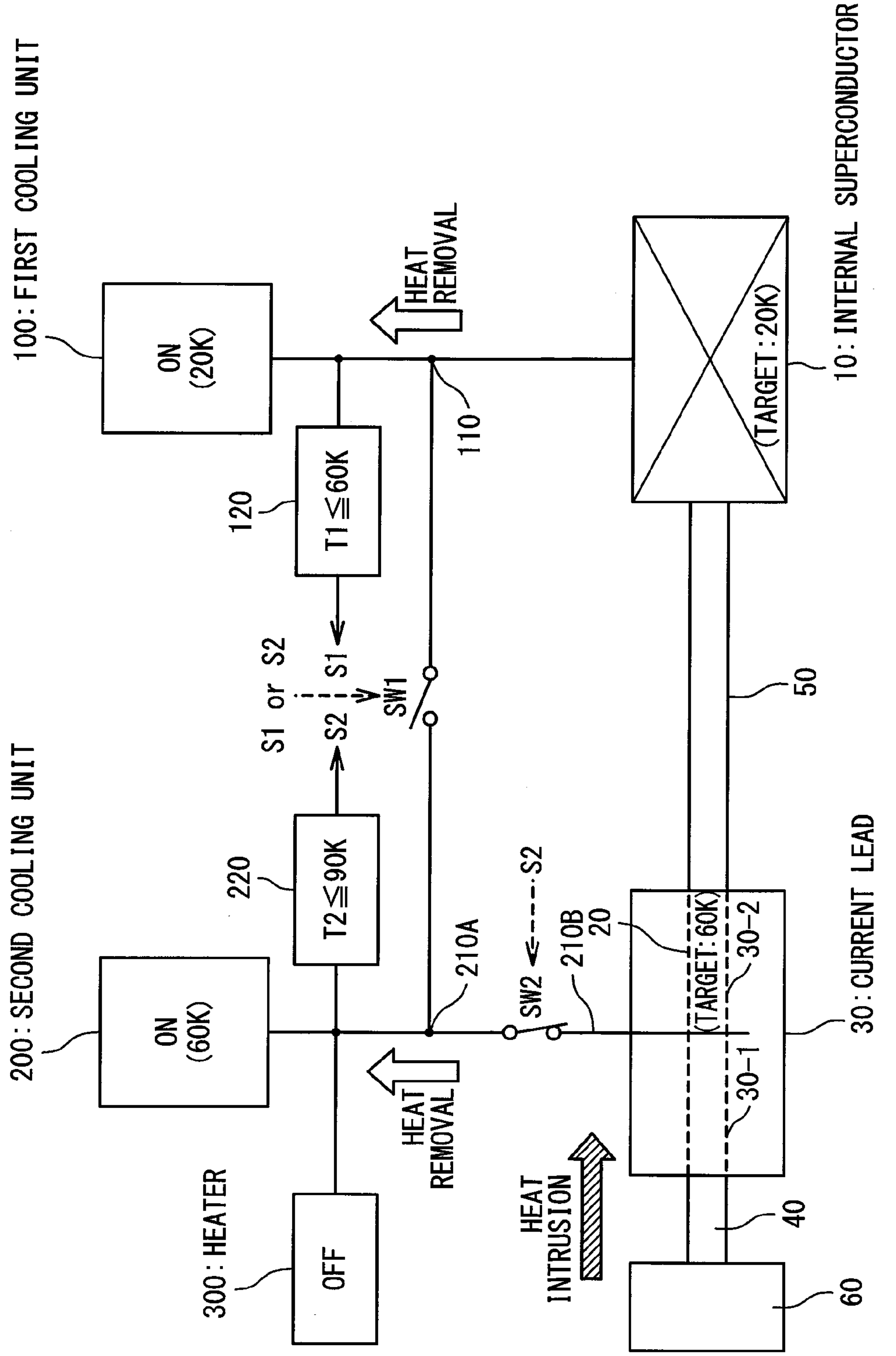
FIG. 8 is a schematic view showing an operation at a time of late cooling and running according to the second embodiment.

FIG. 8 is a schematic view showing an operation at the time of late cooling and running. As shown in FIG. 8, the first thermal conduction switch SW1 is turned OFF and the second thermal conduction switch SW2 is turned ON. Consequently, the first cooling conductor 110 and the cooling unit connector 210A are disconnected from each other and thus the heat transfer between the first cooling conductor 110 and the cooling unit connector 210A is prevented. Moreover, the cooling unit connector 210A and the current lead connector 210B are connected with each other and thus the heat transfer between the cooling unit connector 210A and the current lead connector 210B is possible. At this time, the internal superconductor 10 is cooled (heat removal) by the first cooling unit 100 through the first cooling conductor 110. Moreover, the superconductor 20 is cooled (heat removal) by the second cooling unit 200 through the second cooling conductor 210.

When the first cooling conductor 110 and the internal superconductor 10 are cooled to near the first temperature (20 K) and the second cooling conductor 210 and the superconductor 20 are cooled to near the second temperature (60 K), the late cooling is ended. After that, the current is supplied to the internal superconductor 10 from the external power supply 60 through the current lead 30. At the time of the power distribution to the internal superconductor 10 (the running stage), the first thermal conduction switch SW1 is maintained at the OFF state and the second thermal conduction switch SW2 is maintained at the ON state. The temperature of the internal superconductor 10 is maintained by the first cooling unit 100 and the temperature of the superconductor 20 is maintained by the second cooling unit 200.

The first thermal conduction switch SW1 and the second thermal conduction switch SW2 may be respectively turned OFF and ON manually by an operator.

Alternatively, the first thermal conduction switch SW1 and the second thermal conduction switch SW2 may be respectively turned OFF and ON automatically. For example, when the temperature T1 of the first cooling conductor 110 becomes equal to or lower than a predetermined temperature (e.g. 60 K, which is the target temperature of the superconductor 20), the first temperature sensor 120 deactivates the first switch signal S1. Then, the first thermal conduction switch SW1 is turned OFF in response to the deactivation of the first switch signal S1. Also, when the temperature T2 of the cooling unit connector 210A becomes equal to or lower than a predetermined temperature (e.g. 90 K), the second temperature sensor 220 activates the second switch signal S2. Then, the second thermal conduction switch SW2 is then ON in response to the activation of the second switch signal S2. Alternatively, both the first thermal conduction switch SW1 and the second thermal conduction switch SW2 may be controlled by the second switch signal S2. In this case, the first thermal conduction switch SW1 is turned OFF and the second thermal conduction switch SW2 is turned ON in response to the activation of the second switch signal S2.

Alternatively, the first thermal conduction switch SW1 may be formed of bimetal as described in the first embodiment. Moreover, the second thermal conduction switch SW2 may also be formed of bimetal as in the case of the first thermal conduction switch SW1. In this case, the bimetal is so formed as to be in contact with the cooling unit connector 210A. When the temperature T2 of the cooling unit connector 210A becomes equal to or lower than a predetermined temperature (e.g. 90 K), the bimetal also comes into contact with the current lead connector 210B. Consequently, the second thermal conduction switch SW2 is turned ON.

[Heating Stage]

Figure 9:
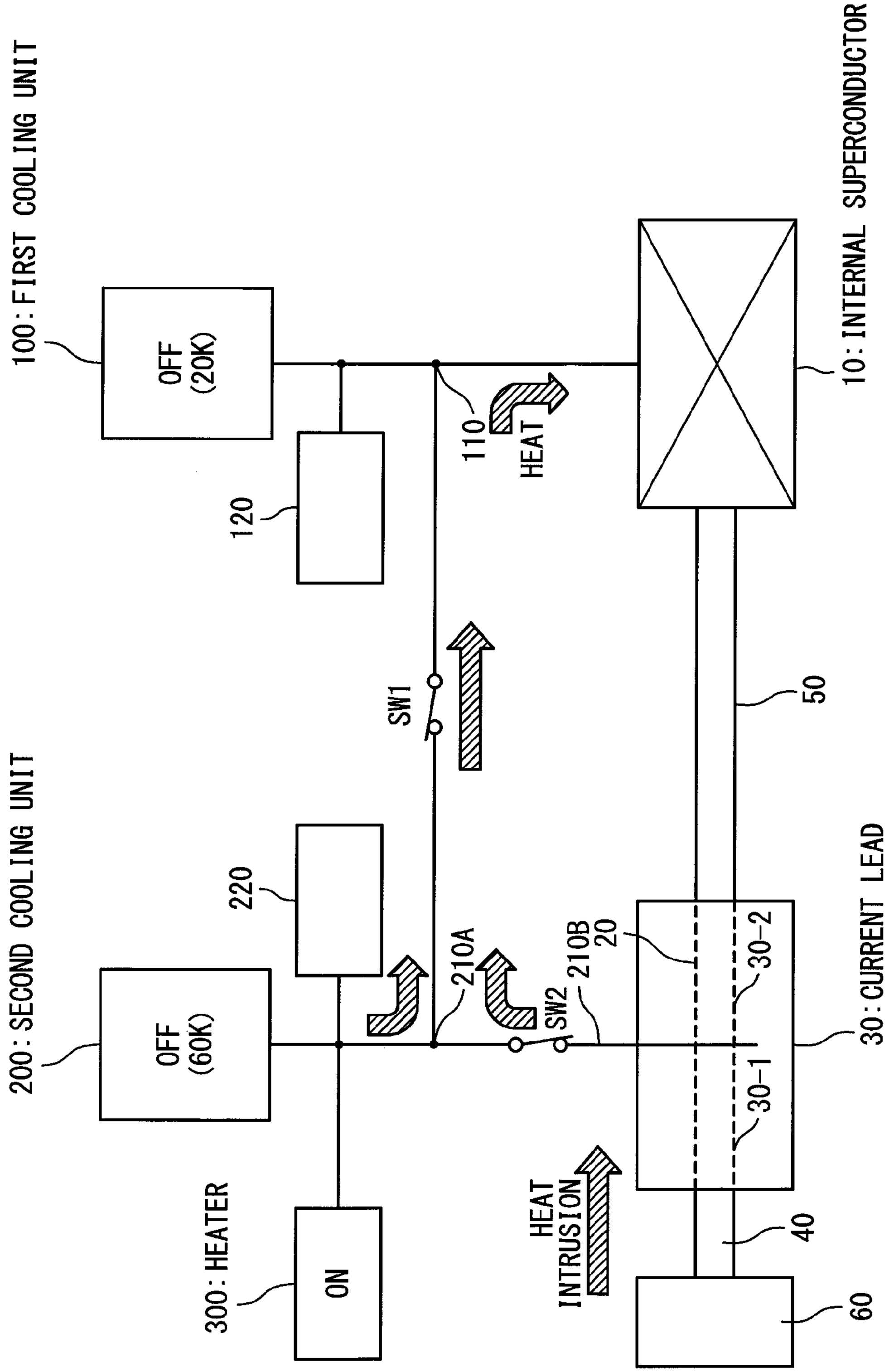
FIG. 9 is a schematic view showing an operation at a time of heating according to the second embodiment.

FIG. 9 is a schematic view showing an operation at the time of heating. At the time of the heating, the first cooling unit 100 and the second cooling unit 200 are turned OFF and the heater 300 is turned ON. Further, according to the present embodiment, the first thermal conduction switch SW1 and the second thermal conduction switch SW2 are turned ON. Consequently, the first cooling conductor 110 and the cooling unit connector 210A are connected with each other and thus the heat transfer between the first cooling conductor 110 and the cooling unit connector 210A is possible. Moreover, the cooling unit connector 210A and the current lead connector 210B are connected with each other and thus the heat transfer between the cooling unit connector 210A and the current lead connector 210B is possible. Owing to the heat intrusion through the current lead 30 and heat generated by the heater 300, the temperatures of the first cooling conductor 110, the second cooling conductor 210, the internal superconductor 10 and the superconductor 20 are increased.

The first thermal conduction switch SW1 and the second thermal conduction switch SW2 may be turned ON manually by an operator. Alternatively, the first thermal conduction switch SW1 and the second thermal conduction switch SW2 may be turned ON automatically.

2-3. Effect

According to the present embodiment, the same effects as in the first embodiment can be obtained. Furthermore, during the initial cooling, the second thermal conduction switch SW2 is turned OFF and thus the second cooling unit 200 and the current lead 30 are disconnected from each other. As a result, the second cooling unit 200 is not affected by heat intrusion through the current lead 30, and thus overall cooling capacity of the second cooling unit 200 can be fully used for cooling the internal superconductor 10. Therefore, the cooling time of the internal superconductor 10 can be reduced further. That is to say, the time to the starting-up of the operation of the internal superconductor 10 can be shortened further.

The present invention can be applied to a SMES (Superconducting Magnetic Energy Storage), a superconducting cable, a superconducting transformer, a superconducting generator, a superconducting motor and so forth.

Embodiments of the present invention have been described above by referring to the attached drawings. The present invention is not limited to the above-described embodiments and changes may appropriately be made by those who skilled in the art without departing from the scope of the invention.

What is claimed is:

1. A superconductor cooling system comprising:

a first superconductor;

a first cooling conductor used for cooling said first superconductor;

a first cooling unit configured to cool said first cooling conductor to a first temperature;

a current lead configured to supply a current to said first superconductor, wherein a part of a path of said current is formed of a second superconductor;

a second cooling conductor used for cooling said second superconductor;

a second cooling unit configured to cool said second cooling conductor to a second temperature; and a first thermal conduction switch connected between said first cooling conductor and said second cooling conductor to ON and OFF heat transfer between said first cooling conductor and said second cooling conductor.

2. The superconductor cooling system according to claim 1, wherein said first thermal conduction switch is turned ON in an initial cooling period before said current is supplied to said first superconductor, and wherein said first thermal conduction switch is turned OFF after said initial cooling period.

3. The superconductor cooling system according to claim 2, further comprising: a first temperature sensor configured to detect a temperature of said first cooling conductor, wherein when said temperature of said first cooling conductor becomes equal to or lower than a predetermined temperature, said first temperature sensor deactivates a first switch signal, and said first thermal conduction switch is turned OFF in response to the deactivation of said first switch signal.

4. The superconductor cooling system according to claim 2, further comprising: a second temperature sensor configured to detect a temperature of said second cooling conductor, wherein when said temperature of said second cooling conductor becomes equal to or lower than a predetermined temperature, said second temperature sensor deactivates a second switch signal, and said first thermal conduction switch is turned OFF in response to the deactivation of said second switch signal.

5. The superconductor cooling system according to claim 2, wherein said first thermal conduction switch is turned ON in a heating period after the supply of said current to said first superconductor is ended.

6. The superconductor cooling system according to claim 1, wherein said second cooling conductor comprises:

a current lead connector located on a side of said second superconductor;

a cooling unit connector located on a side of said second cooling unit; and a second thermal conduction switch connected between said current lead connector and said cooling unit connector to ON and OFF heat transfer between said current lead connector and said cooling unit connector, wherein said first thermal conduction switch is connected between said first cooling conductor and said cooling unit connector to ON and OFF heat transfer between said first cooling conductor and said cooling unit connector.

7. The superconductor cooling system according to claim 6, wherein said first thermal conduction switch is turned ON and said second thermal conduction switch is turned OFF in an initial cooling period before said current is supplied to said first superconductor, and wherein said first thermal conduction switch is turned OFF and said second thermal conduction switch is turned ON after said initial cooling period.

8. The superconductor cooling system according to claim 7, further comprising: a first temperature sensor configured to detect a temperature of said first cooling conductor, wherein when said temperature of said first cooling conductor becomes equal to or lower than a predetermined temperature, said first temperature sensor deactivates a first switch signal, and said first thermal conduction switch is turned OFF in response to the deactivation of said first switch signal.

9. The superconductor cooling system according to claim 8, further comprising: a second temperature sensor configured to detect a temperature of said cooling unit connector, wherein when said temperature of said cooling unit connector becomes equal to or lower than a predetermined temperature, said second temperature sensor activates a second switch signal, and said second thermal conduction switch is turned ON in response to the activation of said second switch signal.

10. The superconductor cooling system according to claim 7, further comprising: a second temperature sensor configured to detect a temperature of said cooling unit connector, wherein when said temperature of said cooling unit connector becomes equal to or lower than a predetermined temperature, said second temperature sensor activates a second switch signal, said first thermal conduction switch is turned OFF in response to the activation of said second switch signal, and said second thermal conduction switch is turned ON in response to the activation of said second switch signal.

11. The superconductor cooling system according to claim 7, wherein said first thermal conduction switch and said second thermal conduction switch are turned ON in a heating period after the supply of said current to said first superconductor is ended.

12. The superconductor cooling system according to claim 1, wherein said first temperature is lower than said second temperature.

13. A superconductor cooling method in a superconductor cooling system, wherein said superconductor cooling system comprises:

a first superconductor;

a first cooling conductor used for cooling said first superconductor;

a first cooling unit configured to cool said first cooling conductor to a first temperature;

a current lead configured to supply a current to said first superconductor, wherein a part of a path of said current is formed of a second superconductor;

a second cooling conductor used for cooling said second superconductor; and a second cooling unit configured to cool said second cooling conductor to a second temperature, wherein said superconductor cooling method comprises:

performing an initial cooling by connecting between said first cooling conductor and said second cooling conductor to cool said first superconductor, before said current is supplied to said first superconductor; and performing a late cooling after said initial cooling, by disconnecting said first cooling conductor and said second cooling conductor from each other to cool said first superconductor and said second superconductor to said first temperature and said second temperature, respectively.

14. The superconductor cooling method according to claim 13, wherein said second cooling conductor includes:

a current lead connector located on a side of said second superconductor; and a cooling unit connector located on a side of said second cooling unit, wherein said performing said initial cooling comprises:

connecting between said first cooling conductor and said cooling unit connector; and disconnecting said current lead connector and said cooling unit connector from each other, wherein said performing said late cooling comprises:

disconnecting said first cooling conductor and said cooling unit connector from each other; and connecting between said current lead connector and said cooling unit connector.

15. The superconductor cooling method according to claim 13, wherein said first temperature is lower than said second temperature.

* * * * *